(12) United States Patent
Krotov et al.

(10) Patent No.: US 7,993,457 B1
(45) Date of Patent: Aug. 9, 2011

(54) DEPOSITION SUB-CHAMBER WITH VARIABLE FLOW

(75) Inventors: Peter Krotov, San Jose, CA (US); Colin F. Smith, Half Moon Bay, CA (US)

(73) Assignee: Novellus Systems, Inc., San Jose, CA (US)

( * ) Notice: Subject to any disclaimer, the term of this patent is extended or adjusted under 35 U.S.C. 154(b) by 1172 days.

(21) Appl. No.: 11/626,328

(22) Filed: Jan. 23, 2007

(51) Int. Cl.
*C23C 16/458* (2006.01)
*C23F 1/00* (2006.01)
*H01L 21/306* (2006.01)
*C23C 16/22* (2006.01)
*C23C 16/06* (2006.01)

(52) U.S. Cl. ............... 118/719; 156/345.31; 156/345.54

(58) Field of Classification Search ............ 118/719; 156/345.31, 345.54
See application file for complete search history.

(56) References Cited

U.S. PATENT DOCUMENTS

| | | | | |
|---|---|---|---|---|
| 4,647,512 A | * | 3/1987 | Venkataramanan et al. | 428/688 |
| 4,671,204 A | * | 6/1987 | Ballou | 118/59 |
| 5,223,001 A | * | 6/1993 | Saeki | 29/25.01 |
| 5,232,508 A | * | 8/1993 | Arena et al. | 118/719 |
| 5,314,574 A | * | 5/1994 | Takahashi | 438/706 |
| 5,534,073 A | * | 7/1996 | Kinoshita et al. | 118/728 |
| 5,578,132 A | * | 11/1996 | Yamaga et al. | 118/724 |
| 5,681,614 A | * | 10/1997 | Omori et al. | 427/248.1 |
| 5,730,801 A | * | 3/1998 | Tepman et al. | 118/719 |
| 5,789,322 A | * | 8/1998 | Brown et al. | 438/689 |
| 5,855,465 A | | 1/1999 | Boitnott et al. | |
| 5,883,017 A | * | 3/1999 | Tepman et al. | 438/800 |
| 5,884,009 A | * | 3/1999 | Okase | 392/418 |
| 5,891,251 A | * | 4/1999 | MacLeish et al. | 118/719 |
| 5,992,453 A | | 11/1999 | Zimmer | |
| 6,013,155 A | | 1/2000 | McMillin et al. | |
| 6,030,881 A | | 2/2000 | Papasouliotis et al. | |
| 6,095,085 A | * | 8/2000 | Agarwal | 118/723 MP |
| 6,132,814 A | | 10/2000 | Livesay et al. | |
| 6,191,011 B1 | * | 2/2001 | Gilboa et al. | 438/488 |
| 6,241,825 B1 | * | 6/2001 | Wytman | 118/733 |
| 6,245,149 B1 | * | 6/2001 | de Lomenie et al. | 118/719 |
| 6,316,063 B1 | | 11/2001 | Andideh et al. | |
| 6,335,261 B1 | | 1/2002 | Natzle et al. | |
| 6,338,626 B1 | * | 1/2002 | Saeki | 432/243 |
| 6,352,943 B2 | | 3/2002 | Maeda et al. | |
| 6,352,953 B1 | | 3/2002 | Seki et al. | |

(Continued)

FOREIGN PATENT DOCUMENTS

JP 5-308071 A 11/1993

(Continued)

OTHER PUBLICATIONS

U.S. Office Action mailed May 14, 2008, from U.S. Appl. No. 11/519,445.

(Continued)

*Primary Examiner* — Rudy Zervigon
(74) *Attorney, Agent, or Firm* — Weaver Austin Villeneuve & Sampson LLP (57) ABSTRACT

An apparatus and method for depositing film on a substrate includes a plurality of conduits that allow by-product and reactant gases to flow past the edge of a substrate. The apparatus and process of the present invention has several advantages for enhanced chamber performance, particularly for micro-volume chambers using pulsed deposition layer processes.

24 Claims, 6 Drawing Sheets

U.S. PATENT DOCUMENTS

| | | | |
|---|---|---|---|
| 6,409,837 B1* | 6/2002 | Hillman | 118/712 |
| 6,455,098 B2* | 9/2002 | Tran et al. | 427/8 |
| 6,477,980 B1* | 11/2002 | White et al. | 118/723 E |
| 6,503,330 B1 | 1/2003 | Sneh et al. | |
| 6,511,539 B1 | 1/2003 | Raaijmakers | |
| 6,534,395 B2 | 3/2003 | Werkhoven et al. | |
| 6,534,802 B1 | 3/2003 | Schuegraf | |
| 6,540,838 B2 | 4/2003 | Sneh et al. | |
| 6,551,339 B2 | 4/2003 | Gavronsky | |
| 6,551,399 B1 | 4/2003 | Sneh et al. | |
| 6,586,349 B1 | 7/2003 | Jeon et al. | |
| 6,626,718 B2* | 9/2003 | Hiroki | 445/6 |
| 6,663,714 B2* | 12/2003 | Mizuno et al. | 118/719 |
| 6,726,520 B2* | 4/2004 | Takeda et al. | 445/62 |
| 6,821,180 B2* | 11/2004 | Kimura et al. | 445/62 |
| 6,835,417 B2 | 12/2004 | Saenger et al. | |
| 6,848,961 B2* | 2/2005 | Nomura et al. | 445/24 |
| 6,867,152 B1 | 3/2005 | Hausmann et al. | |
| 6,867,309 B2 | 3/2005 | Chen et al. | |
| 6,884,738 B2 | 4/2005 | Asai et al. | |
| 6,921,456 B2* | 7/2005 | Biberger et al. | 156/345.26 |
| 6,958,301 B2 | 10/2005 | Kim et al. | |
| 6,972,203 B2* | 12/2005 | Azuma | 438/20 |
| 7,077,917 B2* | 7/2006 | Jones | 134/34 |
| 7,097,878 B1 | 8/2006 | Rulkens et al. | |
| 7,109,129 B1 | 9/2006 | Papasouliotis | |
| 7,129,189 B1 | 10/2006 | Hausmann et al. | |
| 7,135,418 B1 | 11/2006 | Papasouliotis | |
| 7,148,155 B1 | 12/2006 | Tarafdar et al. | |
| 7,151,005 B2* | 12/2006 | Azuma | 438/20 |
| 7,189,427 B2* | 3/2007 | Takeda et al. | 427/77 |
| 7,225,820 B2* | 6/2007 | Jones | 134/200 |
| 7,235,459 B2 | 6/2007 | Sandhu | |
| 7,255,772 B2* | 8/2007 | Biberger et al. | 156/345.26 |
| 7,326,097 B2* | 2/2008 | Nomura et al. | 445/24 |
| 7,381,578 B2* | 6/2008 | Azuma | 438/20 |
| 7,422,636 B2* | 9/2008 | Ishizaka | 118/719 |
| 7,481,882 B2 | 1/2009 | Won et al. | |
| 7,491,036 B2* | 2/2009 | Parent et al. | 417/153 |
| 7,511,425 B2* | 3/2009 | Tsuda et al. | 313/549 |
| 7,670,432 B2* | 3/2010 | Li | 118/715 |
| 7,737,035 B1 | 6/2010 | Krotov et al. | |
| 2001/0036682 A1* | 11/2001 | Takeda et al. | 438/34 |
| 2001/0042514 A1* | 11/2001 | Mizuno et al. | 118/728 |
| 2002/0009944 A1* | 1/2002 | Ouchi | 445/24 |
| 2002/0059904 A1 | 5/2002 | Doppelhammer | |
| 2002/0100418 A1 | 8/2002 | Sandhu et al. | |
| 2002/0123230 A1 | 9/2002 | Hubacek | |
| 2002/0127436 A1 | 9/2002 | Shibamoto et al. | |
| 2002/0157960 A1 | 10/2002 | Dordi et al. | |
| 2002/0195683 A1 | 12/2002 | Kim et al. | |
| 2003/0008602 A1* | 1/2003 | Ashjaee et al. | 451/54 |
| 2003/0015764 A1 | 1/2003 | Raaijmakers et al. | |
| 2003/0121537 A1 | 7/2003 | Dunn | |
| 2003/0134038 A1 | 7/2003 | Paranjpe | |
| 2003/0209324 A1* | 11/2003 | Fink | 156/345.48 |
| 2004/0004247 A1 | 1/2004 | Forbes et al. | |
| 2004/0033662 A1 | 2/2004 | Lee et al. | |
| 2004/0043149 A1 | 3/2004 | Gordon et al. | |
| 2004/0044127 A1 | 3/2004 | Okubo et al. | |
| 2004/0102031 A1 | 5/2004 | Kloster et al. | |
| 2004/0203254 A1 | 10/2004 | Conley et al. | |
| 2004/0206267 A1 | 10/2004 | Sambasivan et al. | |
| 2004/0224496 A1 | 11/2004 | Cui et al. | |
| 2005/0112282 A1 | 5/2005 | Gordon et al. | |
| 2005/0178336 A1 | 8/2005 | Liu | |
| 2005/0181617 A1 | 8/2005 | Bosch | |
| 2005/0191803 A1 | 9/2005 | Matsuse et al. | |
| 2005/0269030 A1* | 12/2005 | Kent et al. | 156/345.31 |
| 2006/0112876 A1 | 6/2006 | Choi et al. | |
| 2006/0213439 A1* | 9/2006 | Ishizaka | 118/715 |
| 2007/0116872 A1* | 5/2007 | Li et al. | 427/248.1 |
| 2007/0116873 A1* | 5/2007 | Li et al. | 427/248.1 |
| 2007/0157683 A1* | 7/2007 | Li | 70/209 |
| 2007/0209588 A1* | 9/2007 | Li | 118/715 |
| 2007/0209590 A1* | 9/2007 | Li | 118/719 |
| 2007/0212484 A1* | 9/2007 | Li | 427/248.1 |
| 2007/0275569 A1 | 11/2007 | Moghadam et al. | |
| 2008/0081114 A1* | 4/2008 | Johanson et al. | 427/273 |

FOREIGN PATENT DOCUMENTS

| | | |
|---|---|---|
| JP | 2004-256479 | 9/2004 |
| WO | WO02/27063 | 4/2002 |
| WO | WO 03/083167 A1 | 10/2003 |

OTHER PUBLICATIONS

U.S. Office Action mailed Dec. 10, 2008, from U.S. Appl. No. 11/519,445.

PCT patent application No. PCT/US07/15979, International Search Report and Written Opinion dated Jan. 10, 2008.

U.S. Appl. No. 10/672,309, Notice of Allowance mailed Nov. 29, 2004.

U.S. Appl. No. 10/874,814, Notice of Allowance mailed Jun. 6, 2006.

U.S. Appl. No. 10/874,808, Notice of Allowance mailed May 18, 2006.

U.S. Appl. No. 11/077,108, Notice of Allowance mailed Jun. 14, 2006.

U.S. Appl. No. 11/077,198, Notice of Allowance mailed Sep. 8, 2006.

U.S. Appl. No. 11/542,723, Office Action mailed Sep. 18, 2009.

U.S. Appl. No. 11/542,723, Notice of Allowance mailed Feb. 9, 2010.

U.S. Appl. No. 11/542,723, Notice of Allowance mailed Apr. 8, 2010.

U.S. Appl. No. 11/542,959, Office Action mailed Apr. 21, 2010.

"Atomic Layer Deposition of Metal Oxide Thin Films," A thesis presented by Dennis Michael Hausmann, Harvard University, 186 pages, Jul. 2002.

Hausmann et al., "Rapid Vapor Deposition of Highly Conformal Silica Nanolaminates," Science, vol. 308, Oct. 2002, 5 Pages.

Gordon et al., "A Kinetic Model for Step Coverage by Atomic Layer Deposition in Narrow Holes or Trenches", Chemical Vapor Deposition 2003, 9, No. 2, pp. 73-78.

Greer et al., "Method and Apparatus to Reduce the Frequency of Chamber Cleans in Rapid Vapor Deposition (RVD) of Silicon Oxide", Novellus Systems, Inc., filed Jul. 12, 2004, U.S. Appl. No. 10/890,376, pp. 1-25.

U.S. Office Action mailed Sep. 22, 2005, from U.S. Appl. No. 10/874,814.

U.S. Office Action mailed Jun. 23, 2005, from U.S. Appl. No. 10/874,808.

Ritala et al., "Atomic Layer Deposition", Handbook of Thin Films Materials, vol. 1, 2002, pp. 103-159.

U.S. Office Action mailed Oct. 6, 2005, from U.S. Appl. No. 10/975,028.

Tarafdar et al., "Sequential Deposition/Anneal Film Densification Method", Novellus Systems, Inc., filed Sep. 11, 2006, U.S. Appl. No. 11/519,445, pp. 1-37.

U.S. Office Action mailed Dec. 7, 2005, from U.S. Appl. No. 10/874,808.

U.S. Office Action mailed Feb. 24, 2006, from U.S. Appl. No. 11/077,108.

U.S. Office Action mailed Mar. 24, 2006, from U.S. Appl. No. 10/975,028.

U.S. Office Action mailed May 23, 2006, from U.S. Appl. No. 11/077,198.

U.S. Office Action mailed Jan. 30, 2007, from U.S. Appl. No. 10/890,376.

Johanson et al., "Apparatus and Method for Delivering Uniform Fluid Flow in a Chemical Deposition System," Novellus Systems, Inc., U.S. Appl. No. 11/542,959, filed Oct. 3, 2006, pp. 1-26.

Lind, et al., "Dual Seal Process Chamber and Process," Novellus Systems, Inc., U.S. Appl. No. 11/542,723, filed Oct. 3, 2006, pp. 1-41.

* cited by examiner

DEPOSITION SUB-CHAMBER WITH VARIABLE FLOW

FIELD OF THE INVENTION

This invention pertains to apparatuses and processes for conducting chemical depositions, and may find particular use in depositing a conformal film of dielectric material with a high degree of surface smoothness and uniformity particularly suited, but not limited, to high aspect ratio features in semiconductor device fabrication.

BACKGROUND OF THE INVENTION

Conformal, uniform dielectric films have many applications in semiconductor manufacturing. In the fabrication of sub-micron integrated circuits (ICs) several layers of dielectric film are deposited. Four such layers are shallow trench isolation (STI), pre-metal dielectric (PMD), inter-metal dielectric (IMD) and interlayer dielectric (ILD). Other applications of conformal dielectric films may be as sacrificial or permanent spacer layers, sacrificial or permanent storage node separation layers, or as dielectric liners for through-wafer vias. All of these layers require silicon dioxide or other dielectric films that fill features of various sizes and have high conformality and uniform film thicknesses across the substrate.

In particular, it is often necessary in semiconductor processing to fill a high aspect ratio gap with insulating material. As device dimensions shrink and thermal budgets are reduced, void-free filling of high aspect ratio (AR) spaces (AR>3.0:1) becomes increasingly difficult due to limitations of existing deposition processes, such as chemical vapor deposition (CVD).

Additionally, challenges associated with shrinking device footprints, increased interconnections, and higher thermal and power loads have created an opportunity for through-wafer vias. New wafer-level packaging technology has evolved from conventional IC interconnect fabrication to the use of through-wafer vias in three-dimensional (3-D) stacked chip packages. Previously, most stacked devices were interconnected by wire bonding at the periphery of the chips. Now, through-wafer vias serve as an electrical connection between stacked chips, analogous to the role of electrical interconnects within an IC. In most embodiments, deep vias are etched through the Si substrate of each device, lined with an insulating material, coated with a diffusion barrier, and filled with a conducting metal. The vias have diameters of approximately 65 um or less and depths of up to 700 um, resulting in high-aspect ratio features that require a highly conformal dielectric film to form a continuous insulating liner in the via.

Other recent and developing applications for conformal, uniform dielectric films are as sacrificial layers in various steps of IC fabrication. A sacrificial layer may be used as a mask for subsequent etching and/or deposition steps, for which a highly uniform film is required. Sacrificial layers may also serve as structural materials during IC fabrication, to be removed following particular processing steps. These applications may require specific film properties relating to conformality, within-wafer uniformity, wet etch rate, mechanical strength, hardness and dielectric constant.

In some applications, the dielectric deposition must take place on a substrate also comprising temperature-sensitive materials with reduced thermal budgets. In that case, the surface preparation, dielectric deposition, and post-deposition treatments must occur at maximum temperatures that may not exceed approximately 100 degrees Celsius, in some embodiments.

An alternative to CVD is atomic layer deposition (ALD). ALD methods involve cycling of self-limiting adsorption steps of reactant gases and can provide thin, conformal films within high aspect ratio features. The ALD process involves exposing a substrate to alternating doses of, usually two, reactant gases. As an example, if reactants A and B are first and second reactant gases for an ALD process, after A is adsorbed onto the substrate surface to form a saturated layer, B is introduced and reacts only with adsorbed A. In this manner, a very thin and conformal film can be deposited. One drawback, however, to ALD is that the deposition rates are very low. Films produced by an ALD cycle are very thin (i.e., about one monolayer); therefore, numerous ALD cycles must be repeated to adequately fill a gap feature. These processes are unacceptably slow in some applications in the manufacturing environment.

Another more recently developed technique useful in dielectric gap fill and other deposition applications in semiconductor processing is referred to as pulsed deposition layer (PDL) processing, sometimes also referred to as rapid surface-catalyzed vapor deposition (RVD). PDL is similar to ALD in that reactant gases are introduced alternately over the substrate surface, but in PDL the first reactant A acts as a catalyst, promoting the conversion of the second reactant B to a film. In ALD the reaction between A and B is approximately stoichiometric, meaning that a monolayer of A can only react with a similar amount of B before the film-forming reaction is complete. The catalytic nature of A in PDL allows a larger amount of B to be added, resulting in a thicker film. Thus, PDL methods allow for rapid film growth similar to using CVD methods but with the film conformality of ALD methods.

PDL-type processes for forming silicon-based dielectrics can use as reactant A, a metal or metalloid catalyst (e.g., trimethylaluminum (TMA)) or metal and metalloid-free catalysts (e.g., an organic acid such as acetic acid ($CH_3COOH$) or an inorganic acid such as phosphoric acid ($H_3PO_4$); and as reactant B, a silicon-containing dielectric precursor. As an example of the use of PDL to deposit silicon dioxide on silicon, the first (catalytic) reagent can be trimethylaluminum (TMA) and the second (silicon-containing) reagent can be tris(tert-pentoxy)silanol (TPOSL). A heated silicon substrate is first exposed to a dose of TMA, which is thought to react with the silicon surface to form a thin layer of surface-bound aluminum complex. Excess TMA is pumped or flushed from the deposition sub-chamber. A large dose of TPOSL is then introduced. The aluminum complex catalyzes the conversion of the silanol to silicon oxide until the silanol is consumed, or the growing film covers or otherwise inactivates the catalytic complex. When excess silanol is used, the film growth is usually self-limiting and a thick and uniform conformal film results.

The most significant difference between dielectric depositions using CVD and PDL or ALD is that in the latter case the catalyst precursors and silicon-containing reactant gas are not present in the reactor at the same time. Instead, they are introduced sequentially, generally with a purging step between to minimize gas-phase reactions and to improve step coverage and uniformity of the film.

In CVD, ALD, or PDL systems, a film is often deposited on the chamber walls in addition to the desired location, on the substrate (e.g., silicon wafer) surface. In ALD and PDL reactors, this unwanted deposition could occur as the precursors adsorb to the walls of the reactor in addition to the substrate surface and subsequently react to form film in later PDL/ALD steps. This film can build up on the chamber walls and can act as a source of chemical contaminants and particulates. It has been well documented for many CVD and ALD/PDL systems that a periodic cleaning of the chamber walls to remove these deposits is beneficial. If these chamber cleans are not performed, the film stresses may be so large that the film delaminates from the chamber wall, leading to particle deposition on the substrate surface. However, these chamber cleans reduce chamber productivity.

To eliminate excess chamber wall deposits, PDL apparatuses have been designed as multi-station deposition reactors. The alternating doses of reactant gases may be delivered at separate stations which are substantially isolated from each other and from the main deposition reactor walls. If the reactant gases are physically, as well as temporally, isolated from each other then they do not contribute to unwanted deposition on chamber surfaces.

Typical CVD and ALD chambers have flow through designs in which process gasses are continuously flowed into and exhausted from the process chamber. In CVD processes the total amount of reaction, and of deposited film, increases with reaction time and reactant dose. Due to the time required for B reactants (i.e., silicon containing precursors) in PDL and RVD processes to react with A reactants, and in some cases due to the high cost of such B reactants, some PDL chambers have been designed to be sealed during deposition. When PDL chambers are sealed, all of the reactants remain in the chamber for the entire duration of the deposition, thus achieving a maximum exposure of the substrate to the reactants. Because no B reactant is exhausted from the process chamber until the reaction is complete, so a smaller dose of the B reactants is required. However, in a sealed deposition chamber, the gas flow dynamics may be non-uniform. It is desirable for points on the substrate surface to be exposed to substantially uniform gas doses, so as to achieve substantially uniform film thickness and conformality, among other properties.

It is therefore desirable to develop a method and apparatus for providing uniform gas-flow dynamics in a partially sealed chamber used for PDL processes.

SUMMARY OF THE INVENTION

The present invention provides apparatus and methods for uniformly depositing film on a substrate including a plurality of conduits that allows by-product and reactant gases to flow past the edge of a substrate. The apparatus and process of the present invention has several advantages for enhanced chamber performance, particularly for micro-volume chambers using pulsed deposition layer processes.

The advantages may include reducing thickness variations across the wafer, particle buildup, film deposition away from the substrate, and dependence on O-ring selection. Additional advantages may include better film uniformity and faster reaction rates.

In one aspect, the invention relates to a chemical deposition apparatus. The apparatus includes a chemical isolation chamber; an evacuation apparatus fluidly connected to the isolation chamber; substrate pedestal module; a vapor injection module for delivering process gases; a deposition sub-chamber formed within the chemical isolation chamber; and a plurality of conduits. The plurality of conduits connects the deposition sub-chamber with the chemical isolation chamber. The conduits are operable to provide a path for process gases and gaseous by-products from the deposition sub-chamber to the isolation chamber and to maintain a pressure differential between the deposition sub-chamber and the isolation chamber during deposition.

The conduits may comprise a variable flow conductor, which may be an orifice, a valve, a flow restrictor, or combinations of these. The variable flow conductor may be defined relative to a specified residence time, the duration that the average reactant molecule in a dose will stay in the chamber and be available to cause a film deposition. For the silanol precursor the residence time may be 5-120 seconds, preferably 50-80 seconds. The actual residence time depends on desired thickness of resulting film and specific process conditions, such as temperature, pressure, precursor flow or dose time.

The variable flow conductors may be defined relative to the total mass flow out of the deposition sub-chamber, as a percentage of the total gas mass in the chamber. The total gas mass in the chamber would include reactant gases, by-product gases, and any inert or carrier gases. During deposition, the variable flow conductors may evacuate about 5-50% of the total gas mass, preferably 5-25%. For a silanol precursor, the dose injected may be 2-500 µmoles, preferably 50-200 µmoles and the flow rate may be 0.5-8.0 µmol/sec.

The variable flow conductors may also be defined as an orifice having a minimum inner diameter of 0.05-0.5 mm in a chamber with 24 variable flow conductors. The orifice may comprise drilled sapphire.

Certain flow restrictors may be passive, such as an orifice or tube. Other flow restrictors, such as a valve, may be actively controllable remotely or locally, prior to or during deposition. The plurality of conduits may be circumferentially arranged around the substrate and may be evenly spaced or may be spaced in such a way to provide uniform reactant flow across the substrate edge. The number of plurality of conduits may be 10 or more and may be located in a seal ring as part of the substrate pedestal module or the showerhead module. In some embodiments, the deposition sub-chamber is smaller than 500 cubic centimeters and approximately 24 conduits are evenly spaced around the circumference of the sub-chamber. A number of the chemical deposition apparatuses may be combined as stations in a multi-station deposition reactor.

In particular embodiments, the apparatus includes two chamber seals, one inner and one outer seal, located between the substrate pedestal module and the showerhead module. The apparatus also includes an evacuation apparatus and a plurality of conduits. The evacuation apparatus fluidly connects to the intermediate space between the inner and the outer seal, and the plurality of conduits connect between the intermediate space and a deposition sub-chamber formed by engaging the inner seal. The plurality of conduits comprise variable flow conductors and are operable to provide path for gaseous by-products and reactants to flow past the edge of a substrate during deposition while maintaining a pressure differential between the deposition sub-chamber and the evacuation apparatus.

In some embodiments, the deposition sub-chamber formed by engaging the inner seal is smaller than 500 cubic centimeters. Each variable flow conductor may be an orifice or may be a valve, controllable remotely or locally. The flow conductance may be varied before or during chemical deposition. The plurality of conduits may be circumferentially arranged around the substrate and may be evenly spaced or may be spaced in such a way to provide uniform flow across the substrate. The number of plurality of conduits may be 10 or more and may be located in a seal ring in the substrate pedestal module or in the showerhead module. The path formed by the plurality of conduits to the evacuation apparatus may route under or over the inner seal.

Some embodiments of the invention relate to the method of conducting a chemical deposition. A substrate is first placed on a substrate support in a deposition sub-chamber. A reactant gas then flows through a vapor injection port to the substrate, causing a film to deposit on the substrate. The method also includes evacuating continuously the by-product and the reactant gas past the edge of the substrate through a plurality of conduits while maintaining a pressure differential between the chamber and evacuation apparatus, where the plurality of conduits comprise variable flow conductors. The pressure differential may be from about 500 mTorr to about 20 Torr.

In some embodiments, the method may further include forming a chemical isolation chamber by engaging the chamber outer seal and forming a deposition sub-chamber by engaging the chamber inner seal. The method may also include disengaging the inner seal, evacuating the lesser volume directly to the evacuation apparatus, and then disengaging the outer seal.

In particular embodiments, the method may also include flowing a catalyst through the vapor injection module to the substrate to saturate the substrate surface and forming a saturated layer of the catalyst on the surface of the substrate. This method may be performed before the film deposition step in a different chamber or in the same chamber. If in the same chamber, it may be performed at a different station or at the same station.

Some embodiments may be practiced as one step in a multi-step pulsed deposition layer process. The reactant gas may be a silanol or another silicon containing precursor. The chamber gases evacuated may be 50% or less of the total gas mass in the chamber, or may be 5-25% of the total gas mass.

These and other features of the invention will be further described in the drawings and detailed description below.

DETAILED DESCRIPTION OF SPECIFIC EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances, well-known processes, procedures and components have not been described in detail so as not to unnecessarily obscure aspects of the present invention.

INTRODUCTION

As indicated, the present invention provides apparatus and associated methods for conducting a chemical deposition.

The apparatus and methods are particularly applicable to use in conjunction with a semiconductor fabrication based dielectric deposition process that requires separation of self-limiting deposition steps in a multi-step deposition process (e.g., atomic layer deposition (ALD) or pulsed deposition layer (PDL) processing for catalyst and silicon precursor deposition), however they are not so limited. In some instances, the apparatus and process of the invention are described with reference to such PDL embodiments.

Generally, an ALD process involves sequentially depositing a plurality of atomic-scale films on a substrate surface by sequentially exposing and removing reactants to and from the substrate surface. An example case of PDL processing using reactant gases A and B will now be used to illustrate principle operations of a PDL process in accordance with the present invention. First, gas A is injected into a chamber and the molecules of gas A are chemically or physically adsorbed to the surface of a substrate, thereby forming a "saturated layer" of A. Formation of a saturated layer is self-limiting in nature and represents a thermodynamically distinct state of adsorbed A on a surface. In some cases, a saturated layer is only one monolayer. In other cases, a saturated layer is a fraction of a monolayer, or some multiple of monolayers.

After a saturated layer of A is formed, typically, the remaining gas A in the chamber is purged using an inert gas and/or pumped using a vacuum pump. In some instances, the substrate is indexed to another station for the subsequent exposure step. There, the gas B is injected so that it comes in contact with the adsorbed layer of A and reacts to form a reaction product. Because the saturated layer of A is thin and evenly distributed over the substrate surface, excellent film step coverage (i.e., conformal films) can be obtained. B is flowed over the substrate for a period of time sufficient to allow the reaction between A and B to preferably go to completion; i.e., all of the adsorbed A is consumed in the reaction. In a PDL dielectric process, B is flowed over the substrate for a period of time sufficient for a large enough quantity of B to be exposed to the substrate, resulting in a film formation in excess of one monolayer. After a desired quantity of B is delivered, the flow of B is stopped. There may be an optional soak time after stopping the delivery of B, to allow enough time to fully complete the reaction. At this point, residual gas B and any by-products of the reaction are purged and/or pumped from the chamber. Further PDL cycles of exposure to A, followed by exposure to B, can be implemented and repeated as needed for multiple layers of material to be deposited.

Another deposition technique related to PDL is atomic layer deposition (ALD). PDL and ALD are both surface-controlled reactions involving alternately directing the reactants over a substrate surface. Conventional ALD, however, depends on self-limiting, typically-monolayer-producing reactions for both reactant gases. As an example, if reactants C and D are first and second reactant gases for an ALD process, after self-limiting amount of C is adsorbed onto the substrate surface to form a saturated layer, D is introduced and a similar self-limiting amount reacts with adsorbed C. In this manner, a very thin and conformal film can be deposited. In PDL, as previously described using reactants A and B, after a self-limiting amount of A is adsorbed onto the substrate surface, a greater amount of B reacts with adsorbed A and is further able to accumulate a self-limiting film that is much thicker than one monolayer. Thus, as stated previously, the PDL process allows for rapid film growth similar to using CVD methods but with the conformality of ALD methods.

ALD and PDL methods are related to the well-established chemical vapor deposition (CVD) techniques. However, in CVD, the chemical reactant gases are simultaneously introduced in a reaction chamber and allowed to mix and chemically react with each other in gas phase. The products of the mixed gases are then deposited on the substrate surface. Thus, ALD and PDL processing methods differ from CVD since in ALD and PDL the chemical reactant gases are individually injected into a reaction chamber and not allowed to mix prior to contacting the substrate surface. That is, ALD and PDL are based on separated surface-controlled reactions.

As indicated above, when ALD or PDL processes are performed in a single chamber where A and B are allowed to mix freely, there will be a film build-up on the interior walls and components of the reaction chamber as well as on the substrate surface. However, if processes A and B are isolated from each other, there will be no sidewall build-up beyond a single monolayer and the chamber will need to be cleaned less frequently.

Some structural solutions to address this issue have been proposed, for example in co-pending, commonly assigned application Ser. No. 10/890,376, filed Jul. 12, 2004 and titled METHOD AND APPARATUS TO REDUCE THE FREQUENCY OF CHAMBER CLEANS IN RAPID VAPOR DEPOSITION(RVD) OF SILICON OXIDE, which describes a multiple deposition space processing reactor suitable for conducting PDL. The disclosure of this application relating to the design and operation of a multiple deposition space processing reactor suitable for conducting PDL is incorporated herein by reference for all purposes. The system has distinct advantages in terms of wafer handling-related process performance and efficiency relative to multiple reactor systems, and in terms of chamber cleaning requirements for single deposition space reactors. Since the precursors are not put into the same deposition space (chamber or chamber region), they do not readily react to deposit and accumulate film on the walls of the chamber. Since there is little or no film growth on the chamber walls, the number of in situ plasma cleans required to keep the particle performance of the chamber within acceptable limits is minimized. This dramatically improves the availability of the tool for processing wafers and reduces the number of particulates formed in the chamber.

Another example of proposed structural solution is co-pending, commonly assigned application Ser. No. 11/542,723, filed Oct. 3, 2006, and titled DUAL SEAL DEPOSITION PROCESS CHAMBER AND PROCESS, which describes apparatus and methods for chemical deposition in a micro-volume chamber that has dual sealing elements at its periphery. The disclosure of the dual seal application is incorporated by reference for all purposes. The dual seal design incorporates the sealing function and mechanism into the wafer handling mechanism by using the pedestal and/or the showerhead module motion to sequence and actuate part or all of the dual seal. The dual seal design also reduces dead legs (an area that is a dead end without fluid flow-through that can become a refuge for by-products or particles that are very difficult to remove by purging the chamber) by providing the sealing point very near the substrate edge. Chemical usage is minimized because a very small chamber volume is formed.

Figure 1:
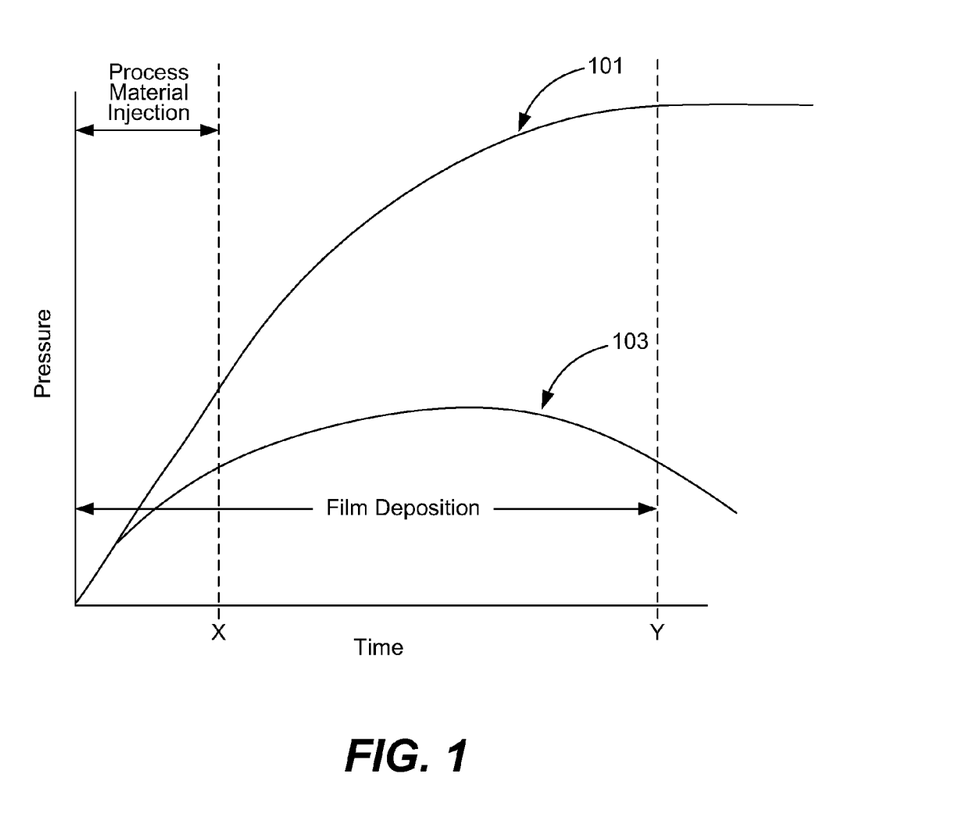
FIG. 1 is an illustration of theoretical chamber pressure versus time.

Even with the separation of the deposition spaces within the main reactor chamber and dual seal design, unwanted film deposition and uniformity issues can still occur. During deposition, a dose of reactant is injected into the chamber through the vapor injection module above the substrate. Material reaches the substrate surface and starts adsorbing, creating a surface film. Chemical reactions or reactant decomposition in the chamber can generate a large amount of gaseous by-products, which dilute the reactant and pressurize the chamber. FIG. 1 shows an illustrative representation of the chamber pressure over time. At time zero, the reactant injection starts and continues until time x. Between time zero and time x, the chamber pressure climbs steadily, as illustrated by curve 101. Film deposition occurs throughout. As the film deposition reactions ensue, pressure builds from the accumulated gaseous reaction by-products and levels off only when the reaction stops. As described above, the film deposition reaction is catalytically-assisted and self-limiting. As all the adsorbed catalysts get used up, the reaction slows to a stop and no more by-products are made. Very high chamber pressure can be problematic when the chamber seal disengages and the pressure quickly reduces to vacuum. A large flow of by-product gas and remaining reactant gas may float and then drop the wafer, causing orientation and positioning problems. Also the wafer movement may damage the wafer and result in unwanted particles in the chamber or on the wafer.

Additionally, expansion of the by-products creates flow flux in alternate directions to the flow of reactants, and expanding gas may back streams into the material delivery and distribution hardware. This may result in chemical reactions occurring far away from the substrate surface and in film depositing on the surface of the vapor injection module (e.g., faceplate, flow distribution baffle and delivery lines). The expanding gas also generates a "bottom-up" (as opposed to top-down) flow path whereby particles move up during the deposition cycle and become trapped and accumulate in the material delivery and distribution hardware.

The gas distribution and delivery hardware are difficult and expensive to clean, so they are usually discarded after the deposited film and trapped particles start to interfere with the deposition process. The effects are usually seen as increased particle count on the substrate, but may also result in changed process parameters as the deposited film on the vapor injection module changes the pressure profile by further restricting gas delivery flow, affecting reaction rates. Chemical reaction rates are also affected by the formation of by-products during the reaction, which dilutes the reactant gas, sometimes by as much as 5 to 10 times. This dilution slows down the chemical reactions and thereby decreases equipment throughput.

The lack of continuous flow of reactants across the substrate surface toward the substrate edge produces an "edge-drop" effect: it slows down chemical reactions and reduces thickness uniformity at the substrate edge. A continuous flow would not only provide fresh reactants to the substrate edge, but also shield the substrate edge from O-ring out-gassing. Because the substrate edge is close to the chamber seal that surrounds the substrate, materials outgassing from the O-ring interact with the substrate edge, resulting in a large dependence of film uniformity on the O-ring material type. Sometimes a continuous flow of reactants is created by a chamber seal leak, which may actually promote uniformity, but only for the substrate edge directly axial to the leak.

The effect of having a small and continuous flow out of the chamber is illustrated as curve 103 on FIG. 1. Initially, as the reactants start to flow, the chamber pressures represented by curve 101 (without flow) and 103 (with flow) are similar. As the reaction ensues, gases flow out of the chamber, reducing the chamber pressure during film deposition. Thus the chamber pressure never reaches a maximum steady state. In fact, given enough time, the chamber would be wholly evacuated.

Therefore, it is desirable to achieve a continuous flow of reactant across the substrate surface toward the substrate edge in a controlled manner to reduce the edge drop effect and to shield the substrate from O-ring out-gassing. It is also desirable to reduce the by-product gas effects on reaction rates and chamber pressure. Further, it is very desirable not to require frequent replacement of material delivery and distribution hardware by reducing film buildup and particle backflow.

The present invention provides an apparatus and method for depositing film on a substrate. In one aspect, the invention relates to a chemical deposition apparatus. The apparatus includes a chemical isolation chamber; an evacuation apparatus fluidly connected to the isolation chamber; substrate pedestal module; a vapor injection module for delivering process gases; a deposition sub-chamber formed within the chemical isolation chamber; and a plurality of conduits. The plurality of conduits connects the deposition sub-chamber with the chemical isolation chamber. The conduits are operable to provide a path for process gases and gaseous by-products from the deposition sub-chamber to the isolation chamber and to maintain a pressure differential between the deposition sub-chamber and the isolation chamber during deposition.

The conduits may comprise a variable flow conductor, which may be an orifice, a valve, a flow restrictor, or combinations of these. The variable flow conductor may also be defined relative to a specified residence time, the duration that the average reactant molecule in a dose will stay in the chamber and be available cause a film deposition. It may also be defined relative to a specified exposure, the dose of the average reactant molecule that is delivered to the substrate. The specified residence time or exposure may vary with the deposition reaction and film required. The residence time for a silanol precursor is between 5 and 120 seconds, preferably 50 and 80 seconds. The actual residence time or exposure depends on desired thickness of resulting film and specific process conditions, such as temperature, pressure, or precursor flow.

The variable flow conductors may also be defined relative to the total flow out of the deposition sub-chamber, as a percentage of the total gas mass in the chamber. The total gas mass in the chamber includes not only reactant gas, but also any by-product gases and inert gases. During deposition, about 5-50% of the total gas mass in the chamber, preferably 5-25%, may flow out through the variable flow conductors. The variable flow conductors may also be defined as having a minimum inner diameter of 0.05-0.5 mm for a 24-conductor chamber.

In particular embodiments, the apparatus includes two seals, one inner and one outer seal, located between the substrate pedestal module and the showerhead module. The apparatus also includes one or more evacuation apparatus and a plurality of conduits. The evacuation apparatus connects to the doughnut shaped region between the inner and the outer seal, and the plurality of conduits connect between a deposition sub-chamber formed by engaging the inner seal and the evacuation apparatus.

In a process aspect, the invention relates to a method of conducting a chemical deposition. A substrate is first placed on a substrate support in a deposition sub-chamber. A reactant gas then flows through a reactant injection port to the substrate, causing a film to adsorb on the substrate. The method also includes continuously evacuating gases in the chamber past the edge of the substrate surface through a plurality of conduits in an exhaust path from the deposition sub-chamber.

Apparatus

Figure 2:
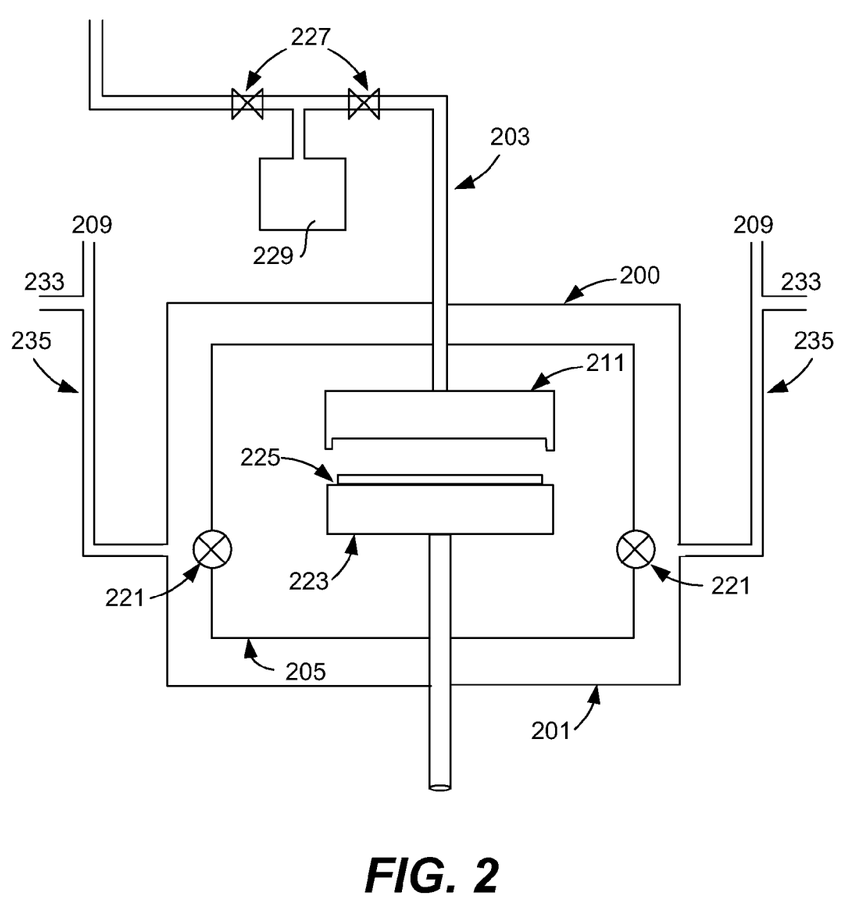
FIG. 2 is a schematic illustration showing a chemical deposition apparatus capable of practicing the present invention.

FIG. 2 is a schematic diagram showing relevant basic features of a chemical deposition apparatus in accordance with the present invention. A substrate 225 sits on top of a moving pedestal module 223 that can be raised or lowered relative to a showerhead module 211, which may also move vertically. Reactant material gases are introduced into the chamber via gas lines 203. Each line may have a corresponding accumulator 229, and can be isolated from the apparatus using isolation valves 227. Note that the apparatus may be modified to have one or more lines with its isolation valves and accumulators, depending on the number of reactant gases used. Also reactant gas delivery lines may be shared between multiple stations.

The chamber is evacuated through vacuum lines 235 that are connected to a vacuum source 209. The vacuum source may be a vacuum pump. In multi-station reactors, particularly those having multiple stations that perform the same deposition process, a vacuum line from another station 233 may share a common foreline with the vacuum line 235. Note that the apparatus may be modified to have one or more vacuum lines per station.

A plurality of conduits 221 connects the deposition sub-chamber 205 and the chemical isolation chamber 201. The plurality of conduits may each comprise a variable flow conductor, which may be an orifice, flow restrictor, or a valve (as shown 221). Although only two conduits are shown, an implementation of the invention will generally have many more conduits. The number of conduits required depends on the chamber size, wafer size and the uniformity requirements for the flow past the substrate edge. More conduits mean that uniformity would be better along the edge. Fewer conduits mean that the flow rate of reactant gas and by-products will change along the wager edge: higher flow near the conduits and less in between. The number of conduits may be more than 10. In one embodiment, 24 conduits are used.

The conduits may be spaced circumferentially around the substrate and may be evenly spaced. In some instances, the spacing of plurality of conduits may be designed to compensate for the locations of the vacuum lines. Because there are generally fewer vacuum lines than there are plurality of conduits, the flow through the conduit nearest to a vacuum line may be higher than one further away. To ensure a smooth flow pattern, the conduits may be spaced closer together if they are further away from the vacuum lines.

Figure 3:
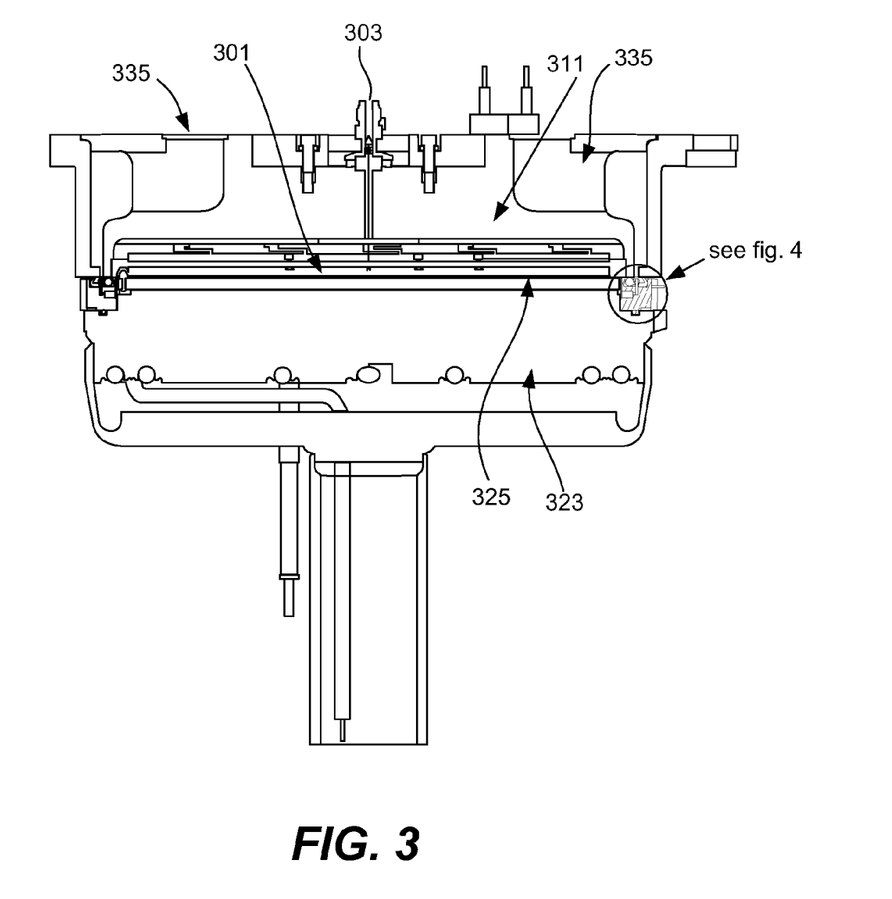
FIG. 3 is a cross section view of one embodiment of a chemical deposition apparatus of the present invention.

FIG. 3 is a cross section view of an embodiment of a deposition sub-chamber of the present invention. FIG. 3 shows a chemical isolation chamber 301, formed between a showerhead module 311 and a pedestal module 323. The substrate 325 sits on top of the pedestal module 323. The distance between top of the substrate 325 and the bottom surface of the showerhead module 311 is between 1 and 10 millimeters, preferably about 4 millimeters. In some embodiments, the temperature inside the chamber may be maintained through a heating mechanism in the showerhead module 211 and/or the pedestal 223. In a preferred embodiment, the showerhead walls can be heated to greater than 250° C., and/or the pedestal can be heated to greater than 250° C. Reactants enter the chamber via vapor inlet 303, and by-products and unreacted reactant exhaust through the vacuum lines 335.

Figure 4:
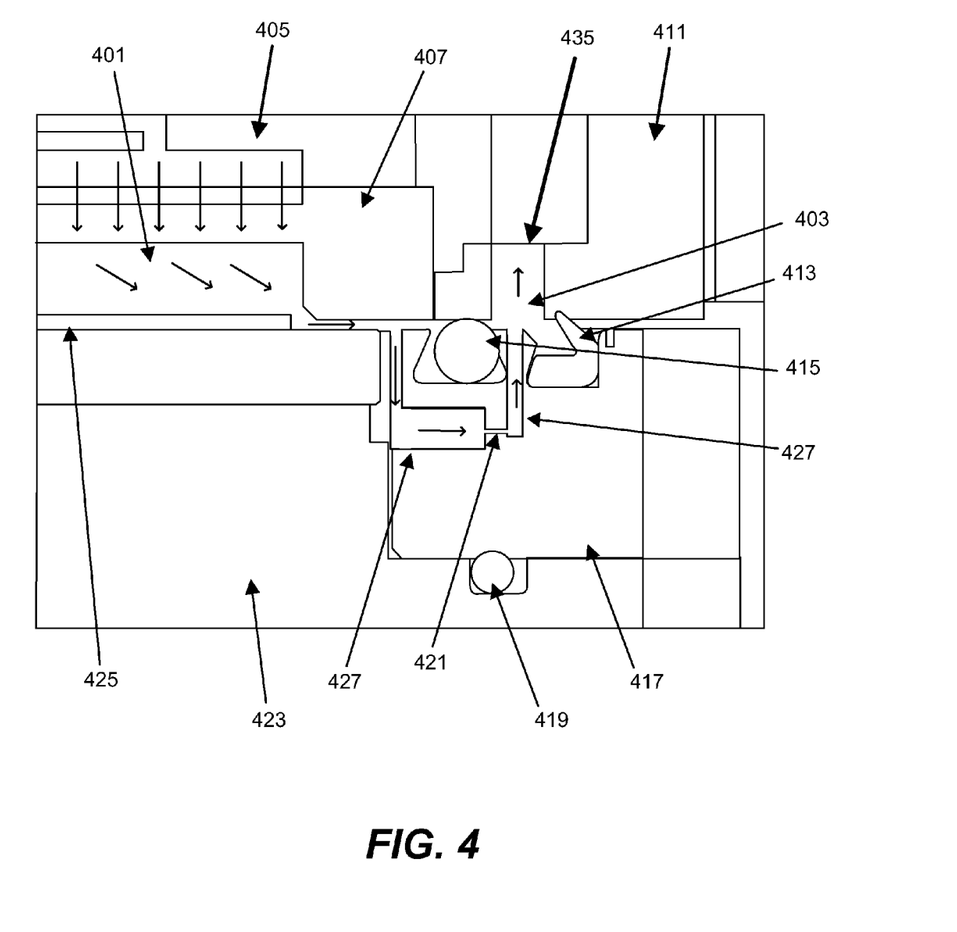
FIG. 4 is a close up view of a part of FIG. 3.

FIG. 4 shows the circled region in FIG. 3 in greater detail. The deposition sub-chamber 401 is formed by engaging the chamber outer seal 413 and chamber inner seal 415 between the showerhead module 411 and the pedestal module 423. Reactant flows in via the reactant inlet (not shown) and is distributed by the vapor distribution baffle 405 and the faceplate 407 (which compose part of the showerhead module 411) to the substrate 425, which sits on top of the substrate pedestal module 423. The pedestal module 423 includes the seal ring 417, which is embedded in the pedestal module 423 and sealed with a seal ring o-ring 419. The seal ring 417 assembly includes a plurality of conduits located axially to the wafer.

These conduits shown include several channels 427 and a variable flow conductor 421. The conduit connects to the vacuum lines 435 via a path around and below the inner seal 415. Although the path shown is around and below the inner seal 415, a path around and above the inner seal 415 may be used. The advantage of an around and below path is that particles from the evacuation apparatus would be less likely to enter the chamber through the plurality of channels 427 and contaminate the chamber parts. Also, the around and below path forces gases to flow around the substrate edge. As shown, the variable flow conductors are each orifices, although valves may be used. Such valves may be locally or remotely controllable. In one embodiment, the orifice is a sapphire component with a precision-drilled hole.

The sizing of the flow restrictor may depend on several factors: the residence time of the reactant, the percentage of total gas mass in chamber to be evacuated relative to the dose, the chamber volume, or a specific inner diameter. The flow restrictor may be sized to achieve a specified residence time, the duration that the average reactant molecule in a dose will stay in the chamber and be available cause a film deposition. For the silanol precursor the residence time may be 5-120 seconds, preferably 50-80 seconds. The actual residence time depends on desired thickness of resulting film and specific process conditions, such as temperature, pressure, precursor flow or dose time. For example, longer residence time means that the reactant stays in the chamber longer, therefore a reaction is more likely to occur so the film thickness may be larger. Other variables affect reaction rates (such as temperature) and reactant concentrations (such as pressure, precursor flow). Once the residence time required to achieve a specified film thickness and properties is determined, then the flow restrictors may be sized accordingly.

The variable flow conductors may be defined relative to the total mass flow out of the deposition sub-chamber, as a percentage of the total gas mass in the chamber. The total gas mass in the chamber would include reactant gases, by-product gases, and any inert or carrier gases. During deposition, the variable flow conductors may evacuate about 5-50% of the total gas mass, preferably 5-25%. For a given precursor, the total gas mass in chamber may be determined for a dose and flow rate. For silanol, the dose injected may be 2-500 µmoles, preferably 50-200 µmoles and the flow rate may be 0.5-8.0 µmol/sec.

The variable flow conductors may also be defined as having a minimum inner diameter of 0.05-0.5 mm, the actual inner diameter would depend on variables such as number of conduits, chamber size, chamber volume, process pressure, dose size (amount of reactants injected), chemistry type, desirable film thickness, soak time, and conductance of the showerhead.

The seal ring 417 may be designed such that the variable flow conductor 421 may be changed or replaced based on different process gas evacuation requirements for the chemical deposition. Also the variable flow conductor may be changed for cleaning and replacement. The plurality of conduits may also be formed through a gap of several microns between the chamber inner seal 415 and either the showerhead module 411 or the seal ring 417 imbedded in the pedestal module 423. The preferred embodiment of the conduit is having an orifice as the variable flow conductor with a flow path around and under the chamber inner seal.

The chamber inner seal 415 and outer seal 413 are circumferential elastomeric seals. The circumferential elastomeric seals should be composed of a material with thermal and chemical stability to the temperatures and reactants in the operating environment of the reactor. For example, in various implementations, the material would normally be subjected to temperatures ranging from about −100 to 300° C., although stability over a subset of this full range will be adequate for most applications. In semiconductor applications, stability to acidic and metallic catalysts and silicon-containing precursors used in ALD or PDL processes would be needed. The material should also have adequate resistance to mechanical cycling to be able to retain its elastomeric sealing and other important properties through repeated opening and closing of the deposition sub-chamber and isolation chamber. In addition, the material should generate few or no particulates in the course of reactor operations and should have little or no chemical out-gassing. Suitable materials for preferred implementations include prefluoroelastomers. Examples include KALREZ, available from DuPont and G-67P, available from Perlast. The latter is a nano-filled perfluoroelastomer that is particularly preferred in many applications. In some instances, such as where a dual-circumferential elastomeric seal is used, the desired properties of the elastomeric material may be more applicable to one of the seals than the other, and VITON may also be used as a seal material.

An advantage of this configuration is that the total volume inside the deposition sub-chamber 401 is much smaller than the isolation chamber or main reactor volume. For example, using a gap about 4 mm between the substrate and the lower surface of the showerhead and a 300 mm wafer, the total volume of the sub-chamber may be less than about 0.5 L. A smaller chamber volume uses less process material. FIGS. 3 and 4 shows the apparatus in the fully closed position with both seals engaged, the position during deposition.

In the various embodiments described above, and in the specific case of PDL $SiO_2$, one station is dedicated to exposure of the catalyst (e.g., aluminum-containing precursor), which may be trimethyl aluminum, while another station is dedicated to expose the wafer to silanol or another silicon-containing precursor. Individual stations can be constructed or lined with materials suitable for the processes that will be performed within each station, as will be understood by those of skill in the art. For example, aluminum may be used as the principal material for fabrication of the chambers, reactors and apparatus described herein.

Of course, one or both seals can also be borne by the showerhead module, and the deposition sub-chamber can be opened or closed by movement of either or both of the showerhead module and the substrate pedestal module.

Process and Methods

Figure 5:
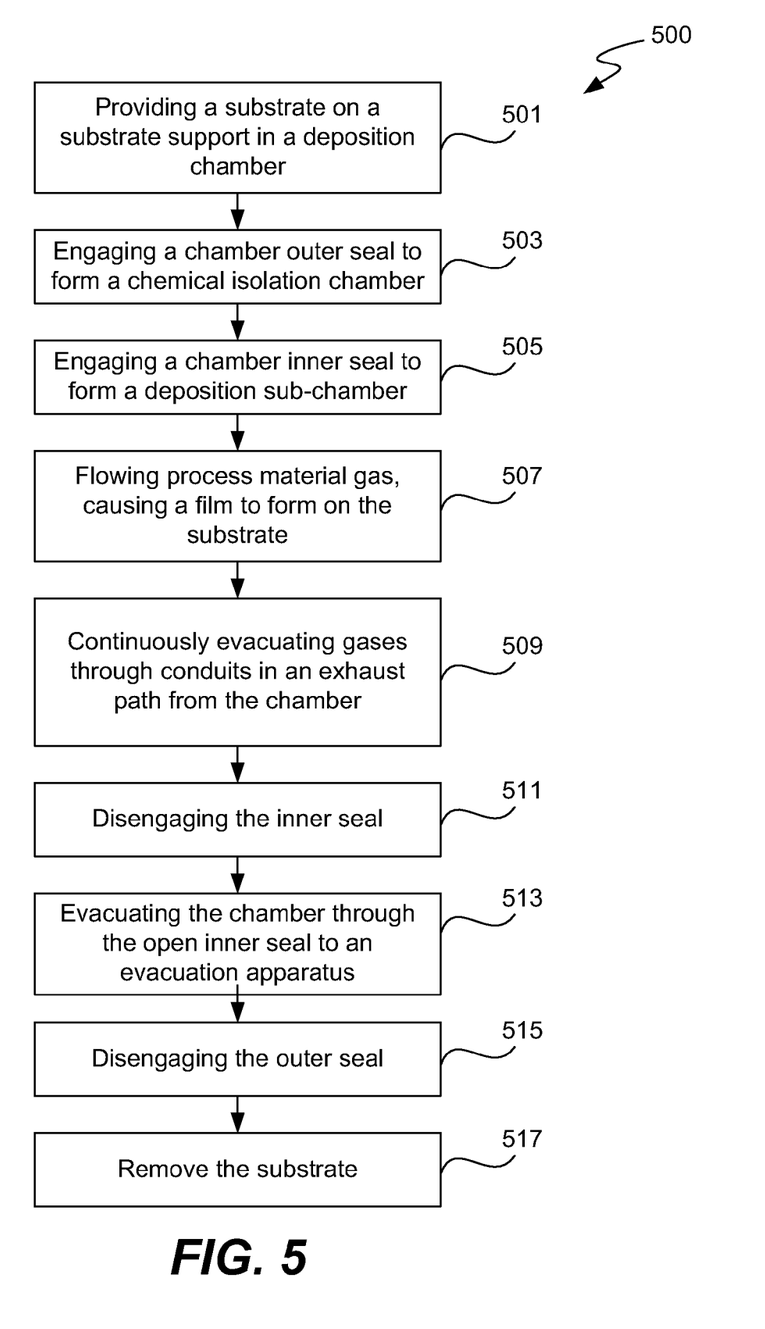
FIG. 5 is a process flow diagram of an embodiment of this invention.

The present invention also provides a method of chemical deposition that involves continuously evacuating gases in the chamber past the edge of the substrate surface through a plurality of conduits in an exhaust path from the deposition sub-chamber. FIG. 5 shows a process flow chart of depositing a film on a substrate in an apparatus described above.

A substrate is first placed on a substrate support in a main chamber. A chamber outer seal 503 is engaged to form a chemical isolation chamber 501; then a chamber inner seal 505 is engaged to form a deposition sub-chamber. In this embodiment, the chamber outer seal and the chamber inner seal may be engaged at different times because they are offset vertically from each other. As shown on FIG. 4, the top surface of chamber outer seal 413 is closer to the bottom surface of the showerhead module than the top surface of chamber inner seal 415. The chamber formed by engaging the chamber outer seal is the chemical isolation chamber; the chamber formed by engaging the chamber inner seal is the deposition sub-chamber. The deposition sub-chamber formed may have a volume less than 500 cubic centimeters.

After engaging both seals to make the deposition sub-chamber, a reactant gas is flowed through a vapor injection module 507. The reactant gas may be a silicon containing precursor for depositing $SiO_2$, such as silanol. The reactant gas causes a film to be formed on the substrate, producing by-product gas(es). The film may form as part of a PDL or ALD process. As the reactant gas flows into the chamber and during deposition and optional soak time, the chamber is evacuated continuously to a evacuation apparatus through plurality of conduits in an exhaust path from the chamber 509.

The plurality of conduits comprises variable flow conductors. Each flow restrictor may be an orifice, a flow restrictor, a valve, or other such flow conductor. The minimum inner diameter of a flow restriction orifice maybe 0.05-0.5 mm. Only a small amount of the gas inside the chamber is evacuated, less than 50%, preferably between 5 and 25% of the total gas mass in the chamber. This evacuation forces a flow of reactant gas during the injection across the substrate and past the edge of the substrate. The result is uniform film deposition because all parts of the substrate experience substantially uniform reactant gas flow during deposition.

After the desired film thickness is reached, the chamber inner seal is disengaged 511 without disengaging the chamber outer seal. All remaining gas in the chamber is then evacuated to the vacuum lines through the open inner seal 513. In a multi-station reactor, two or more stations may share vacuum lines and an evacuation apparatus. Note that reactant injection stops before the chamber inner seal is disengaged. Reactant injection may occur quickly, so as to achieve maximum concentration of reactants in the chamber, and may stop before film deposition reactions are completed.

Figure 6:
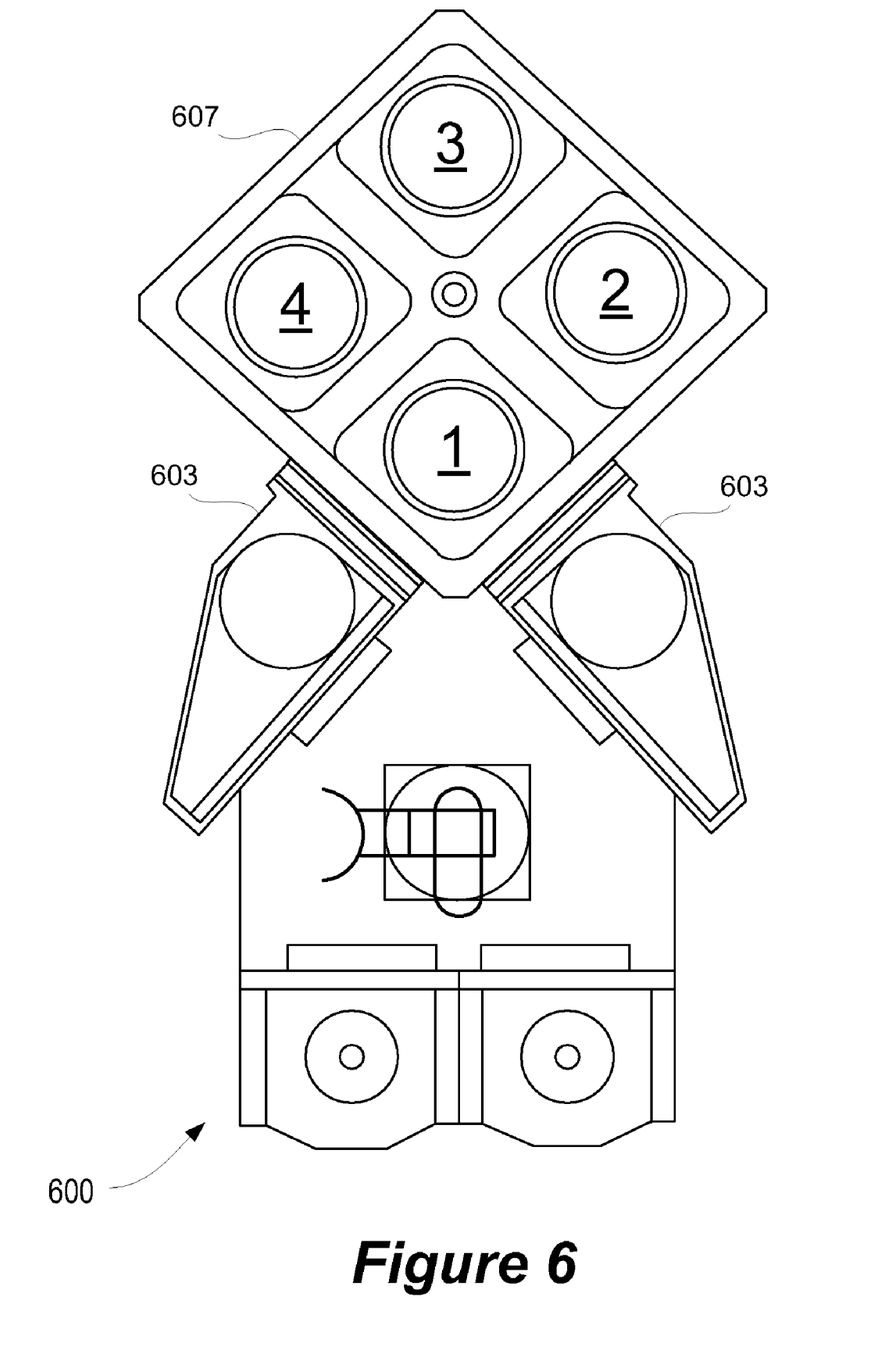
FIG. 6 is a schematic of an apparatus suitable for practicing the present invention.

After the chemical isolation chamber is evacuated, then the chamber outer seal is disengaged 515. FIG. 6 shows an example semiconductor processing tool 600a having multi-station reactor in accordance with the invention. The chambers (e.g. stations) numbered 1 to 4 share the reactor 607. Evacuating the isolation chamber first minimizes the dispersion of by-product gas and reactant gas to the reactor environment that may affect reaction in another chamber. For example, if silicon-containing precursor gas is dispersed out of chamber 2, it may deposit a film on the chamber parts of chambers 1 and 3 that just performed a metal catalyst saturation step. Such unwanted film deposit may cause particle problems on the substrate. Finally, the substrate will be removed from the chamber 517 and be transferred either to the loadlocks 603, if the film deposition occurred in the last chamber of the reactor, or to another chamber for more processing.

In a PDL process, the film is deposited by a two step process: a catalyst saturation step, where the substrate surface is saturated with a catalyst, which may or may not contain a metal; and a film deposition step, where a silicon containing precursor gas is flowed into the chamber to react with the catalyst on the substrate surface. The process described above may be a part of a PDL process as the film deposition step. The process may be practiced on a multi-station sequential deposition reactor. One or more stations may be the apparatus described above and the process described above may be practiced on the one or more stations. A system suitable for practicing the present invention may be the Novellus Altus™ tool having a single or dual 4-station deposition scheme or a Novellus Vector™ tool having a single or dual 4-station deposition scheme. Altus™ and Vector™ tools are produced by Novellus Systems of San Jose, Calif.

CONCLUSION

Although the foregoing invention has been described in some detail for purposes of clarity of understanding, it will be apparent that certain changes and modifications may be practiced within the scope of the invention. It should be noted that there are many alternative ways of implementing both the process and apparatus of the present invention. For example, while the invention has been described primarily in the context of semiconductor fabrication, it is not so limited. Accordingly, the present embodiments are to be considered as illustrative and not restrictive, and the invention is not to be limited to the details given herein, but may be modified to encompass equivalents.

All documents cited herein are hereby incorporated by reference in their entirety and for all purposes.

What is claimed:

1. An apparatus, comprising:
a chemical isolation chamber;
a deposition sub-chamber formed within the chemical isolation chamber;
a substrate pedestal module, the substrate pedestal module comprising a pedestal base located within the chemical isolation chamber,
   wherein the substrate pedestal module is configured to be movable between a first position and a second position,
   wherein an annular gap fluidly connects the deposition sub-chamber and the chemical isolation chamber when the substrate pedestal module is in the first position, and
   wherein the annular gap fluidly connecting the deposition sub-chamber and the chemical isolation chamber when the substrate pedestal module is in the first position is hermetically sealed when the substrate pedestal module is in the second position;
a gas delivery module for delivering process gases; and
an evacuation apparatus fluidly connected to the isolation chamber;
a plurality of conduits fluidly connecting the deposition sub-chamber with the chemical isolation chamber,
   wherein the plurality of conduits permits fluidic flow between the deposition sub-chamber and the chemical isolation chamber when the substrate pedestal module is in the second position, and
   wherein the plurality of conduits is configured to maintain a pressure differential between the deposition sub-chamber and the isolation chamber when the substrate pedestal module is in the second position during a deposition process.

2. The apparatus of claim 1, wherein the plurality of conduits are situated to provide a substantially uniform radial flow of the process gases delivered by the gas delivery module across a substrate supported by the substrate pedestal module.

3. The apparatus of claim 1, wherein each conduit comprises an interface for accepting a component including a flow restrictor and the component including the flow restrictor.

4. The apparatus of claim 1, wherein each conduit in the plurality of conduits comprises a flow conductor comprising one or more selected from the group consisting of an orifice, a valve, a flow restrictor and combinations thereof.

5. The apparatus of claim 1, wherein the deposition sub-chamber has a total process volume of less than 500 cubic centimeters when the substrate pedestal module is in the second position.

6. The apparatus of claim 4, wherein the flow conductor comprises a drilled sapphire orifice.

7. The apparatus of claim 4, wherein the flow conductor has a flow control configured to be varied prior to or during deposition.

8. The apparatus of claim 1, wherein the plurality of conduits are arranged in a radial pattern on the substrate pedestal module.

9. The apparatus of claim 8, wherein the conduits in the radial pattern are evenly spaced from each other.

10. The apparatus of claim 1, wherein the plurality of conduits comprises at least 10 conduits.

11. The apparatus of claim 1, wherein the plurality of conduits are configured to achieve a residence time for the process gases of between 5 and 120 seconds.

12. The apparatus of claim 1, wherein the plurality of conduits are configured to evacuate 5-50% of the total mass of the process gases in the deposition sub-chamber during a deposition process.

13. The apparatus of claim 1, wherein the plurality of conduits comprises 24 conduits and wherein each conduit comprises a variable flow conductor with a minimum inner diameter of 0.05-0.5 mm.

14. The apparatus of claim 1, wherein the substrate pedestal module further comprises a seal ring, wherein the plurality of conduits is located in the seal ring.

15. The apparatus of claim 1, wherein the apparatus is configured to be one of a plurality of deposition apparatuses in a multi-station deposition tool.

16. An apparatus, comprising:
a reactor chamber;
a showerhead module comprising a process gas delivery port;
a substrate pedestal module comprising a substrate support region, the substrate pedestal module configured to be movable between a first position and a second position in the reactor chamber, wherein an annular gap between the substrate pedestal module and the showerhead module fluidly connects the substrate support region with the reactor chamber when the substrate pedestal module is in the first position;
an inner seal and an outer seal, the inner seal and the outer seal each configured to hermetically seal the annular gap between the substrate pedestal module and the showerhead module and prevent fluid flow between the substrate support region and the reactor chamber when the substrate pedestal support module is in the second position, wherein the inner seal and the outer seal define a seal region located between the inner seal and the outer seal;
an evacuation apparatus fluidly connected to the seal region; and
a plurality of conduits fluidly connecting the seal region with a deposition sub-chamber defined by the showerhead, the substrate pedestal module, and the inner seal when the substrate pedestal module is in the second position,
wherein the plurality of conduits permits fluidic flow between the deposition sub-chamber and the seal region when the substrate pedestal module is in the second position, and
wherein the plurality of conduits is configured to maintain a pressure differential between the deposition sub-chamber and the seal region when the substrate pedestal module is in the second position.

17. The apparatus of claim 16, wherein the plurality of conduits are configured to evacuate 5-50% of the total mass of gases introduced into the deposition sub-chamber during a deposition process performed within the reactor chamber.

18. The apparatus of claim 16, wherein the deposition sub-chamber has a total process volume of less than 500 cubic centimeters when the substrate pedestal module is in the second position.

19. The apparatus of claim 16, wherein each conduit comprises one or more selected from the group consisting of an orifice, a valve, a flow restrictor, and combinations thereof.

20. The apparatus of claim 18, wherein each conduit comprises a drilled sapphire orifice.

21. The apparatus of claim 15 wherein the substrate pedestal module or the showerhead module further comprises a seal ring, and wherein the plurality of conduits is located in the seal ring.

22. The apparatus of claim 21, wherein the conduits in the plurality of conduits are routed below the inner seal.

23. The apparatus of claim 21, wherein the conduits in the plurality of conduits are routed above the inner seal.

24. The apparatus of claim 16, wherein the apparatus is configured to be one of a plurality of deposition apparatuses comprising a multi-station deposition tool.

* * * * *